United States Patent
Visweswariah (10) Patent No.: US 7,086,023 B2
(45) Date of Patent: Aug. 1, 2006

(54) SYSTEM AND METHOD FOR PROBABILISTIC CRITICALITY PREDICTION OF DIGITAL CIRCUITS

(75) Inventor: Chandramouli Visweswariah, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 339 days.

(21) Appl. No.: 10/666,470

(22) Filed: Sep. 19, 2003

(65) Prior Publication Data

US 2005/0066298 A1    Mar. 24, 2005

(51) Int. Cl.
*G06F 17/50* (2006.01)
(52) U.S. Cl. .................. 716/6; 716/4; 716/5
(58) Field of Classification Search .......... 716/6, 716/5, 4
See application file for complete search history.

(56) References Cited

OTHER PUBLICATIONS

Ababei et al., "Timing Minimization by Statistical Timing hMetis-based Partitioning", Jan. 2003, IEEE 16th International Conference on VLSI Design, Paper Digest pp. 56-63.*
Statistical Timing of Parametric Yield Prediction of Digital Integrated Circuits, by J.A.G. Jess, K. Kalafala, S.R. Naidu, R.H.J.M. Otten, C. Visweswariah, pp. 932-937, Design Automation Conference 2003.
Fast Statistical Timing Analysis By Probabilistic Event Propagation, by Jing-Jia Liou, Kwang-Ting Cheng, Sandip Kundu, and Angela Krstic, pp. 661-666, Design Automation Conference 2001.
Explicit Computation of Performance as a Function of Process Variation by Lou Scheffer, TAU '02, pp. 1-8.
Timing Yield Estimation from Static Timing Analysis, by Anne Gattiker, Sani Nassif, Rashmi Dinakar, and Chris Long, pp. 437-442, International Symposium on Quality Electronic Design, 2001.

* cited by examiner

*Primary Examiner*—Sun James Lin
(74) *Attorney, Agent, or Firm*—Satheesh K. Karra; Hoffman, Warnick & D'Alessandro LLC (57) ABSTRACT

The present invention is a system and method for determining criticality probability of each node, edge and path of the timing graph of a digital circuit in the presence of delay variations. The delay of each gate or wire is assumed to consist of a nominal portion, a correlated random portion that is parameterized by each of the sources of variation and an independent random portion. Correlations are taken into account. Both early mode and late mode timing are included; both combinational and sequential circuits are handled; static CMOS as well as dynamic logic families are accommodated. The criticality determination complexity is linear in the size of the graph and the number of sources of variation. The invention includes a method for efficiently enumerating the critical path(s) that is/are most likely to be critical.

48 Claims, 7 Drawing Sheets

SYSTEM AND METHOD FOR PROBABILISTIC CRITICALITY PREDICTION OF DIGITAL CIRCUITS

FIELD OF THE INVENTION

This invention relates to design automation of digital integrated circuits. More specifically, it relates to static timing analysis of digital circuits in the presence of delay variations. Yet more specifically, the invention relates to determining probabilities of individual nodes and edges of the circuit's timing graph being critical, and to probabilistic enumeration of critical paths.

RELATED APPLICATIONS

C. Visweswariah, "System and Method for Statistical Timing Analysis of Digital Circuits," U.S. patent application Ser. No. 10/666,353 filed on Sep. 19, 2003.

C. Visweswariah, "System and Method for Incremental Statistical Timing Analysis of Digital Circuits," U.S. patent application Ser. No. 10/665,092 filed on Sep. 18, 2003.

The descriptions set forth in these co-pending applications are hereby incorporated into the present application by reference in their entirety.

BACKGROUND OF THE INVENTION

With each succeeding generation of integrated circuit technology, variability is proportionately increasing. The sources of such variability include manufacturing variations, device fatigue, environmental variations and phase-locked loop (PLL) variations. In the case of manufacturing variations, the front-end-of-the-line (FEOL) which are the layers that define the active transistors show variation in the transistor's electrical characteristics. Physical quantities such as the length of the gate, depth of the semiconductor junction or thickness of the oxide cannot be perfectly controlled during manufacturing and hence show variations, which lead to variations in the behavior of the transistors. As the physical dimensions get smaller in modern technologies, variability is proportionately increasing. In addition, the back-end-of-the-line (BEOL), which consists of the metal interconnect layers, also exhibits variability. For example, the thickness, width and inter-layer dielectric thickness of each metal layer are sources of variability. These in turn cause the wires to change their delay, and in fact these sources of variability can change the delay of gates which are driving them and gates which are driven by them.

The second main type of variations is due to device fatigue effects such as hot electron and negative bias temperature instability (NBTI). After a long period of use in the field, transistor characteristics change due to these physical phenomena, leading to changes in the delay of circuit components.

The third main type of variations is due to environmental effects such as temperature and power supply voltage.

The fourth main type of variations is PLL variations which can include PLL jitter and duty-cycle variability.

It is to be noted that in addition to the above, there are other sources of variation such as model-to-hardware mis-correlation, silicon-on-insulator (SOI) history effects and coupling noise. These other types of variation can also be considered during statistical timing analysis of digital integrated circuits.

The variation of delays shown by gates and wires in an integrated circuit can be classified in many different ways. The variation may be from batch-to-batch during the manufacturing, wafer-to-wafer, chip-to-chip or within a single chip. Lens aberration effects during photolithography, for example, can cause variation of the effective length of transistors across a reticle field. There can be temperature and power supply voltage variations across a chip. The variations can also be classified by the time scales during which variability develops. For instance, fatigue effects cause variability over a period of years, whereas across the chip temperature or power supply gradients can develop over seconds or milliseconds, and coupling noise variations can occur in nanoseconds or picoseconds. Whichever way they are classified, it is abundantly clear that these sources of variation are making integrated circuit analysis and design more difficult and must be accurately accounted for during timing analysis.

The traditional timing methodology to handle such variability is to conduct multiple static timing analyses at different "cases" or "corners" to determine the spread of performance of the circuit under these variations. Corners may include, for example, "best case," "nominal" and "worst case." Unfortunately, the traditional methodology is breaking down because the number of independent and significant sources of variation is numerous, and too many timing runs would be required. One way to combat this is to worst-case or guard-band against some sources of variation, but this causes pessimism in the performance prediction. Another way to combat the explosion of timing runs required is to skip the analysis at certain corners, but this is risky since the performance of the circuit may be unacceptable at the skipped corners and this may be manifested by chips failing on the tester or in the field. Because of these effects, traditional timing methodologies are rapidly becoming burdensome, as well as risky and pessimistic at the same time.

A solution to the problems faced by traditional timing methodologies is statistical or probabilistic timing analysis. In such an analysis, timing quantities such as delays, arrival times and slacks are not treated as single numbers, but rather as probability distributions. Thus the full probability distribution of the performance of the circuit under the influence of variations is predicted by a single timing run. The problems of unnecessary risk, excessive timing runs and pessimism are all potentially avoided. Four examples of such statistical timing methods in the prior art include Liou et al [J-J. Liou, K-T. Cheng, S. Kundu and A. Krstic, "Fast statistical timing analysis by probabilistic event propagation," Proc. Design Automation Conference, June 2001, Las Vegas, Nev., pages 661–666], Scheffer [L. Scheffer, "Explicit computation of performance as a function of process variation," Proc. ACM/IEEE workshop on timing issues in the specification and synthesis of digital systems, December 2002, Monterey, Calif., pages 1–8], Gattiker et al [A. Gattiker, S. Nassif, R. Dinakar and C. Long, "Timing yield estimation from static timing analysis," Proc. IEEE International Symposium on Quality Electronic Design (ISQED), 2001, pages 437–442] and Jess et al [J. A. G. Jess, K. Kalafala, S. R. Naidu, R. H. J. M. Otten and C. Visweswariah, "Statistical timing for parametric yield prediction of digital integrated circuits," Proc. Design Automation Conference, June 2003, Anaheim, Calif., pages 932–937]. The references cited above are herein incorporated by reference in their entirety.

PROBLEMS WITH THE PRIOR ART

There are several reasons why prior-art methods are not suitable in practice. The main shortcoming of prior-art methods is their failure to correctly account for correlations. The delays of gates and wires on an integrated circuit exhibit strong correlation. Consider a simple example to demonstrate the importance of correlations. A chip that has 50,000 latches has 50,000 setup timing tests and 50,000 hold timing tests. Assume that the probability of each of these tests being successfully met is 99.99%. If the 100,000 probabilities are perfectly correlated, then the overall probability of the chip working correctly is 99.99%. That is, if one test passes, they will all pass. However, if the probabilities are independent, then the probability of making a working chip is 0.9999 raised to the $100,000^{th}$ power, which is a paltry yield of 0.005%!

There are many sources of delay correlation, and some examples are described below. Two paths may share some of the same gates; in this case, the delays of the two paths are correlated. If a particular chip has stronger P-type transistors due to some manufacturing variations, chances are that every single P-type transistor on that chip will be stronger. If the $3^{rd}$ level of metal is a little thicker, it is likely to be thicker across the entire chip. A launching path (path that gets the data signal to a latch) and a capturing path (path that gets the corresponding clock signal to the same latch) may exhibit some commonality and therefore have correlated delays. The commonality could include sharing some gates along the path, sharing metal layers, sharing a power supply voltage island, sharing gates of the same type, etc. Delays of gates may also be correlated because of their physical position on the surface of a chip. For example, two gates that are close to each other are unlikely to see significant relative channel length variation and their delays are therefore likely to be tightly correlated.

All of these sources of variation must be accurately taken into account, or else the results will not be meaningful. In Liou et al, the delay of each individual gate is considered to be completely independent of any other gate, rendering the analysis unusable in practice. In Gattiker et al, gate delay correlations are considered. Critical paths are enumerated, but when the effects of these paths are combined, the delay of each path is considered to be independent of any other, thus ignoring several important sources of correlation.

Among the prior art methods, one that takes into account correlation is Jess et al. This method is a path-based method. The delay or slack of each path is collected and represented as a first-order model of the sources of variation. Then the slack of the overall circuit or chip is computed by combining these path slacks in a correlated probabilistic fashion. Unfortunately, there are an exponential number of paths in any circuit. It is not realistic to list and analyze all the paths in the circuit. Jess et al suggest that the top N critical paths be considered, but of course there is no guarantee that the $(N+1)^{st}$ path (or any path other than the first N paths) will not be critical at some point or corner in the process space or space of variations. All path-based methods have the fundamental limitation that the number of paths is too large and some heuristic must be used to limit the number of paths submitted for detailed analysis.

It is to be noted that although there are many significant sources of correlation in the delay variability of integrated circuits, there are some completely random sources of variation as well. For example, the oxide thickness in transistors in a modern technology is only a few atoms thick and for various reasons it is possible for transistors to have one more or one less layer of atoms, leading to variations that are quite random from transistor-to-transistor. While the prior-art method of Liou et al can handle such random variations, other prior-art methods such as those of Gattiker et al and Jess et al cannot.

Further, all of the above prior-art methods have a number of other shortcomings. As soon as timing analysis is completed, the next natural question is, "What is the critical path?" so that optimization effort to improve the circuit's timing performance can be appropriately directed. None of the prior-art methods describes how to obtain an ordered list of the critical paths, nor do they predict the probability of a path being critical. They do not obtain the probability of any node or edge of the timing graph of the circuit being critical.

For these and other reasons, statistical timing methods that have been proposed in the literature are not used in industrial practice.

ASPECTS OF THE INVENTION

An aspect of this invention is a system and method to determine the criticality probability of each edge, node and path of the timing graph of a digital circuit, in the presence of delay variations.

Another aspect of this invention is a method for criticality probability determination with linear complexity in the size of the timing graph and the number of sources of variation.

Another aspect of this invention is a method that determines the single most likely critical path of a digital circuit.

Another aspect of this invention is a method that enumerates the most likely critical paths of a digital circuit along with their probabilities of being critical.

Another aspect of this invention is a method for criticality probability determination that takes into account correlations between delays of individual gates and wires, and correlations between delays of paths of the circuit.

Another aspect of this invention is a method for criticality probability determination that allows delay models that contain a deterministic part, a correlated random part and an independent random part.

SUMMARY OF THE INVENTION

The present invention is a system and method for determining criticality probability of each node, edge and path of the timing graph of a digital circuit in the presence of delay variations. The delay of each gate or wire is assumed to consist of a nominal portion, a correlated random portion that is parameterized by each of the sources of variation and an independent random portion. Correlations are taken into account. Both early mode and late mode timing are included; both combinational and sequential circuits are handled; static CMOS as well as dynamic logic families are accommodated. The criticality determination complexity is linear in the size of the graph and the number of sources of variation. The invention includes a method for efficiently enumerating the critical path(s) that is/are most likely to be critical.

BRIEF DESCRIPTION OF THE FIGURES

The foregoing and other objects, aspects, and advantages will be better understood from the following non-limiting detailed description of preferred embodiments of the invention with reference to the drawings that include the following.

DETAILED DESCRIPTION OF THE INVENTION

Figure 1:
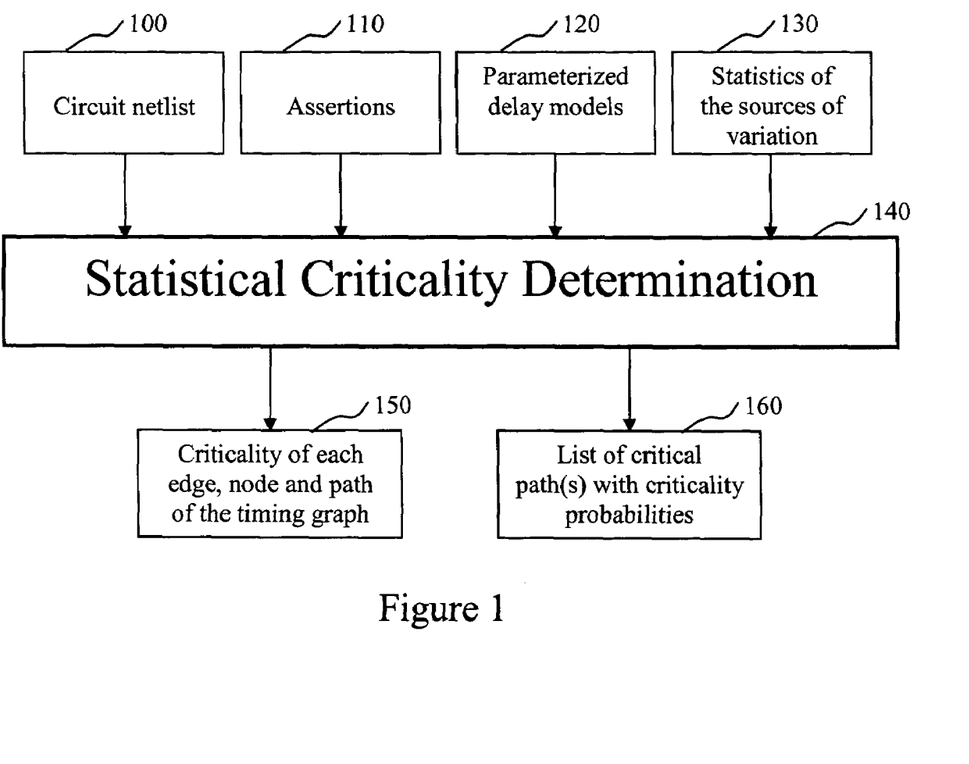
FIG. 1 is a block diagram of one preferred embodiment of the invention depicting criticality determination.

An inventive statistical criticality determination flow is shown in FIG. 1. The first input is the netlist representing the structure of the circuit to be analyzed, shown in box 100. The second input is a set of timing assertions, box 110. These typically include arrival times at the primary inputs, required arrival times at the primary outputs, information about the phases of the clock, and details of external loads that are driven by the primary outputs. The assertions can be in the form of deterministic numbers or independent probability distributions or correlated probability distributions. The third input is a set of parameterized delay models, box 120. These allow the timer to determine the delay of all components of the electrical circuits (such as gates or wires) as a function not only of traditional delay-model variables (like input slew or rise/fall time, and output load) but also as a function of the sources of delay variation. For example, a first-order linear model may be employed, like the one shown below:

$$\text{delay} = a_0 + \sum_{i=1}^{n} a_i \Delta x_i + a_{n+1} \Delta R,$$

where the delay consists of a deterministic (constant) portion $a_0$, a correlated (or global) portion $$\sum_{i=1}^{n} a_i \Delta x_i$$

and an independent random (or local) portion $a_{n+1} \Delta R$. The number of sources of variation is n, and $a_i$, $i=1,\Lambda$, n are the sensitivities of the delay to the sources of variation $x_i$, $i=1,\Lambda$, n, and $a_{n+1}$ is the sensitivity to an independent random source of variation R. The notation $\Delta x_i$ denotes the deviation of $x_i$ from its mean or nominal value, and $\Delta R$ denotes the deviation of R from its mean or nominal value. It is to be understood that the delay models can be stored in a pre-characterization step or calculated on the fly as required. The format in which they are stored could include analytical delay equations or table models. The next input is information about the statistics of the sources of variation, box 130. This input typically contains a list of the sources of variation with a mean value and standard deviation for each source of variation. Any correlations between the sources of variation are specified here.

The statistical criticality determination program, box 140, accepts all of these inputs and produces two types of criticality reports. Box 150 shows a report that includes the criticality probability of each edge, node and path of the timing graph. Criticality information may also contain the probability of passing each timing test at each latch or dynamic circuit, and the probability that each end point determines the slack of the overall circuit. Box 160 shows a report that lists critical paths in order of probability of being critical. Either a specified number of critical paths are reported, or critical paths are listed till their cumulative probability exceeds a user-specified threshold. It is to be understood that the circuit being timed can be very large and can consist of millions of gates and wires. All the information mentioned above could be extremely voluminous, and so it is ordinary practice to provide options to selectively output the required information, or even calculate or graphically display all this information on-demand.

Figure 2:
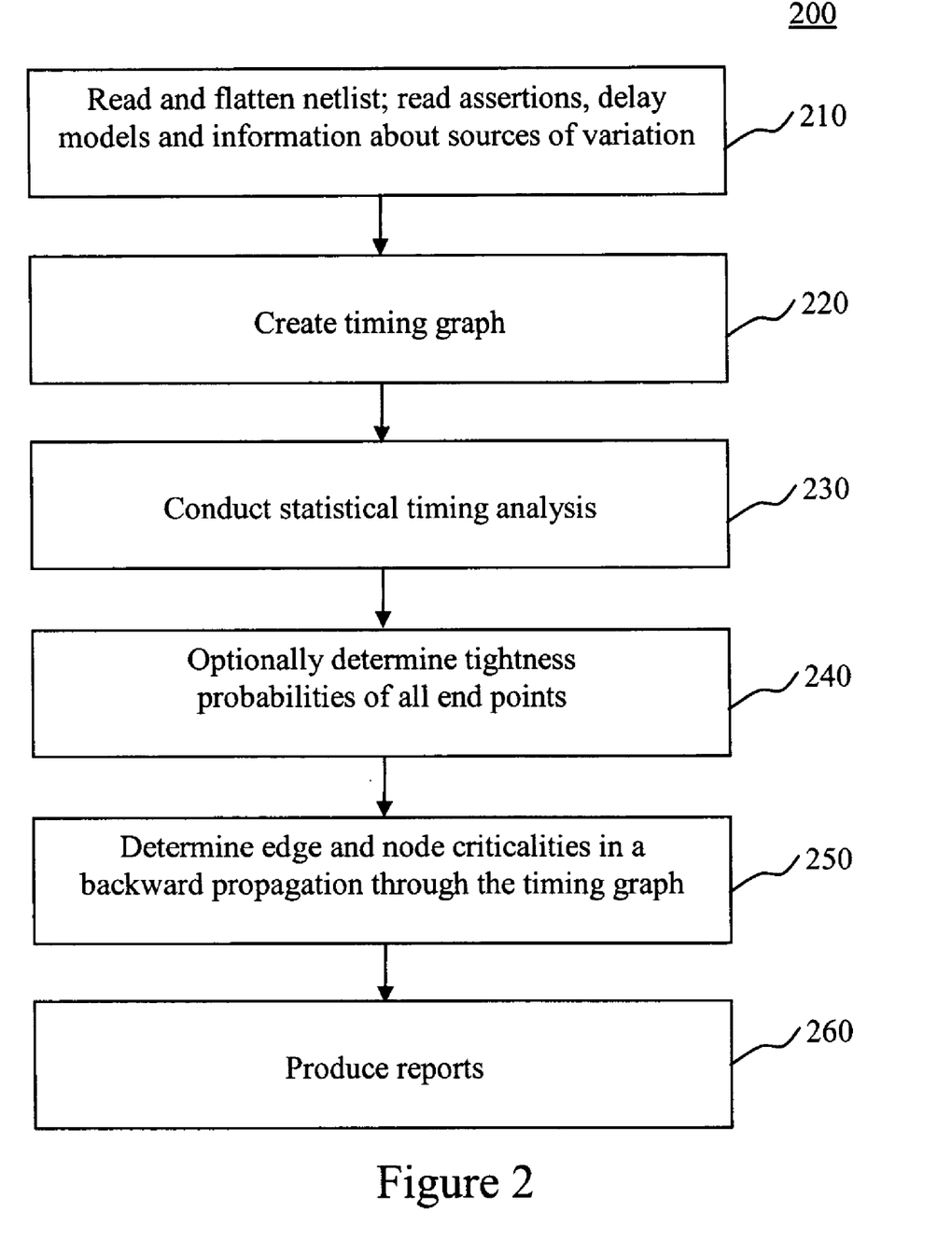
FIG. 2 is a flow chart of the preferred method of determining criticality of every node, edge and path of the timing graph of a digital circuit.

Next, the inventive criticality determination (box 140 of FIG. 1) is explained in detail in reference to FIG. 2. The first step (box 210) is to read the netlist that contains details of the topology of the circuit to be timed. Since this netlist is often in hierarchical form, it is flattened (i.e., the number of levels of hierarchy is reduced). The assertions (each of which can be either deterministic or probabilistic) are read and so are the parameterized delay models. Information about the sources of variation such as the mean and standard deviation values and any correlations between the sources of variation are inputted and stored in memory in box 210.

The next major step, shown in box 220, is the construction of the timing graph, which is a step that is familiar in all static timing programs. In the graph, each node represents a node or signal of the circuit and each arc or edge represents a delay in the circuit incurred when a logical transition (from low to high or high to low) is transmitted through a circuit component such as a gate or wire. All possible valid logical transitions of the circuit are therefore captured in this graph. Arrival times are typically stored on the nodes of the graph and delays of individual gates and wires on the edges of the graph. An arrival time in late mode is the earliest time at which the corresponding signal is guaranteed to be stable at its correct logical value, and an arrival time in early mode is the earliest time at which the corresponding signal can change from its previous cycle stable logical value (i.e., the output cannot change later than the late mode arrival time and cannot change earlier than the early mode arrival time). Sequential elements and dynamic circuits in the graph are represented by a special kind of edge called a test segment, which is an indication to the timing program that a timing test must be performed between two nodes of the graph to ensure correct timing operation of the circuit. Building of such a graph for both gate-level netlists and transistor-level netlists is known in the prior art.

The next step is to conduct statistical timing analysis of the electrical circuit, box 230, which is preferably, but not necessarily, conducted as taught in the co-pending application: C. Visweswariah, "System and Method for Statistical Timing Analysis of Digital Circuits," U.S. patent application Ser. No. 10/666,353 on Sep. 19, 2003. During the statistical timing analysis, arrival and required arrival tightness probabilities on each edge of the timing graph are saved for future use.

Next, in box 240, the tightness probabilities of all end points are determined by an inventive method that will be described in detail later. This is an optional step. If overall criticality probabilities are desired on a per-end-point basis, this step can be skipped. However, if overall criticality probabilities are desired for the entire electrical circuit, then this step is required. Next, in box 250, a backward propagation is carried out to determine the criticality probabilities of each edge and node of the timing graph by an inventive method that will be explained later. Finally, in box 260, timing reports are produced of the type in boxes 150 and 160 of FIG. 1, either in a file or as return values of a function call. These reported values can include probabilities of individual timing tests being met; probabilities of primary outputs meeting their required arrival times; arrival tightness probabilities, required arrival tightness probabilities; node criticality probabilities; edge criticality probabilities; path criticality probabilities; a list of paths ordered by path criticality. A list of paths in order of criticality probability is useful to the user or calling program in order to direct effort at optimizing the timing of the circuit.

It is to be understood that the forward propagation phase of the regular statistical timing of box 230 can optionally be combined with the end point criticality determination step of box 240 for efficiency purposes; likewise, the backward propagation phase of the regular statistical timing of box 230 can optionally be combined with the backward propagation required to determine edge and node criticality probabilities in box 250 for efficiency purposes.

The details of the inventive calculations involved in boxes 240 and 250 are explained in the following paragraphs, in relation to FIGS. 3, 4, 5 and 6. The explanation below pertains only to late mode analysis, but is easily extended to early mode analysis as well. With each edge of the timing graph is associated an arrival tightness probability (determined during forward propagation of regular statistical timing analysis), a required arrival tightness probability (determined during backward propagation of regular statistical timing analysis) and an edge criticality probability. Associated with each node of the timing graph is a node criticality probability. The procedures below describe how the edge and node criticality probabilities are determined.

Figure 3:
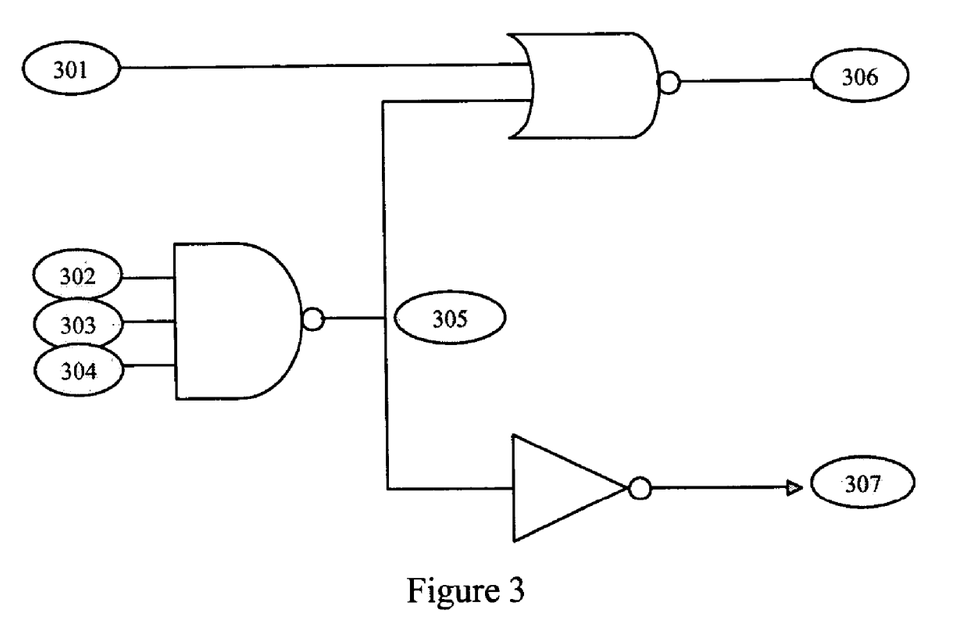
FIG. 3 shows a sample combinational circuit to demonstrate criticality analysis.
Figure 4:
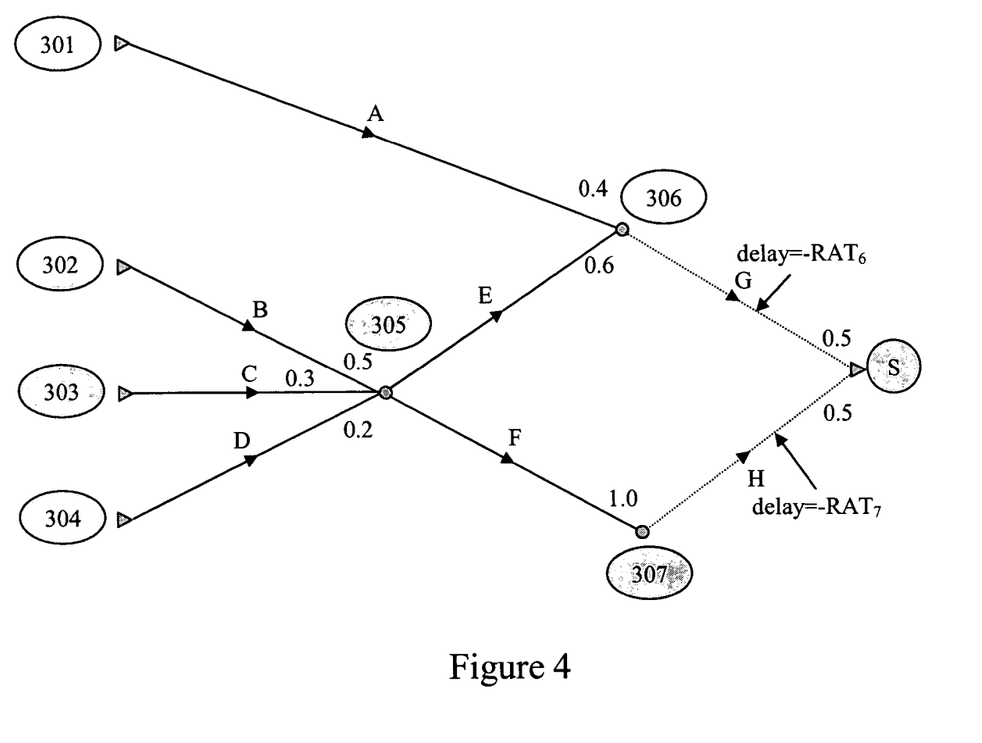
FIG. 4 shows the timing graph corresponding to the circuit of FIG. 3, with various forward-propagation arrival tightness probabilities annotated on the graph.

FIG. 3 shows a simple combinational circuit to demonstrate statistical criticality determination. The circuit has four primary inputs labeled 301, 302, 303 and 304, one internal timing point labeled 305, and two primary outputs labeled 306 and 307. FIG. 4 shows the directed acyclic timing graph corresponding to the circuit of FIG. 3. The arrival tightness probabilities of edges A, B, C, D, E and F that were determined during box 230 of FIG. 2 are annotated on FIG. 4. The arrival tightness probabilities shown in FIG. 4 were arbitrarily chosen and are for demonstration purposes only. Once the primary outputs 306 and 307 are reached, the forward propagation of arrival times is complete. We would like to determine path criticality probability as a product of arrival tightness probabilities along each path. So we now need to determine the probability of the end points of the timing graph (the two primary outputs 306 and 307 in our simple example) being critical, which is the task of box 240 of FIG. 2. To do this, the timing graph is augmented with two dotted-line edges, G and H, from the respective end points to a fictitious graph node called the "sink" which has been labeled S in FIG. 4. The delay of each such edge is the negative of the asserted required arrival time of the corresponding primary output. Now a statistical "max" operation is performed at the sink node of the graph for late mode analysis. Arrival tightness probabilities are computed in the same manner as during regular statistical timing analysis. For illustration, tightness probabilities of 0.5 and 0.5 were chosen.

In this augmented graph, if a path is to be critical, the edges along the path must determine the arrival time of the sink node of every single edge along the path. Therefore, the criticality of each path is simply the product of the arrival tightness probabilities along the path. For example, path 303-C-305-E-306-G-S has a criticality probability of 0.3× 0.6×0.5=0.09 or 9%. The criticality probability can thus be computed for every path in this graph, and it can be observed that the criticality probabilities of all the paths add up to 1.0 or 100%. It is to be understood that this procedure can be readily extended to sequential and dynamic circuits where there is a dotted line edge of the appropriate delay introduced from each test segment of the graph to the sink node. The appropriate delay will be in terms of the clock arrival time and the guard time of the timing test.

If this procedure (box 240 of FIG. 2) is skipped, then each end point is assigned a criticality probability of 1.0 and criticality computations continue, but on a per-endpoint basis.

Figure 5:
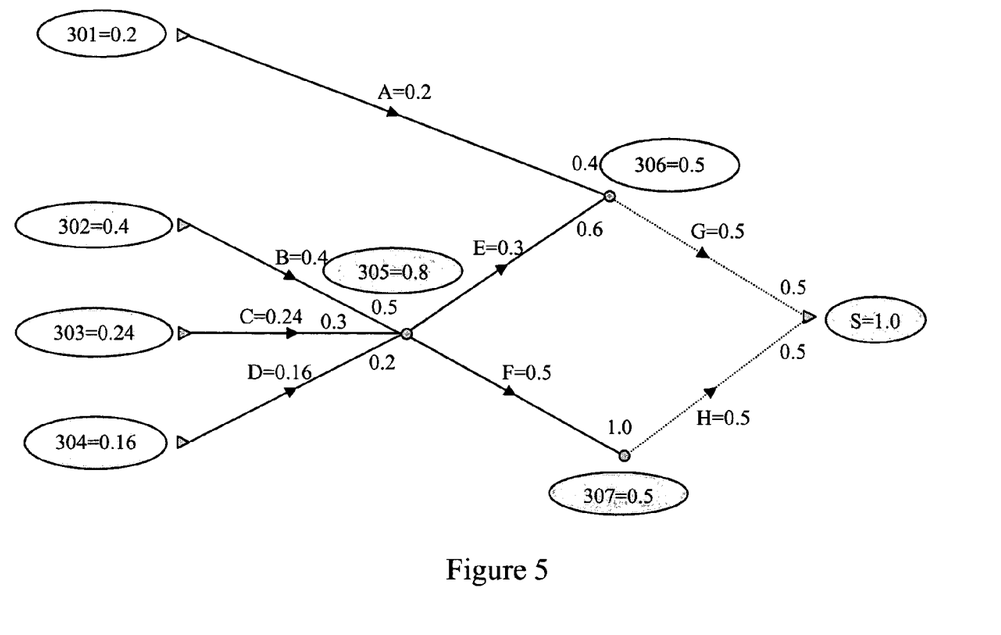
FIG. 5 shows the timing graph corresponding to the circuit of FIG. 3, with various node criticality probabilities and edge criticality probabilities annotated on the graph.

Next, we will focus on the procedure for box 250 of FIG. 2. Referring to FIG. 5, the backward propagation of edge and node criticality probabilities begins by noting that the sink node has a criticality probability of 1.0 since all paths must pass through the sink node. Node probabilities are depicted in FIG. 5 by ovals containing the node number. Since edges G and H have a 0.5 arrival tightness probability, the criticality probability of these two edges is also 0.5, since whichever is "tight" will be on the critical path. Moving on, the criticality probability of nodes 306 and 307 are simply the criticality probabilities of edges G and H, respectively, since nodes 306 and 307 have just one fanout each. Next, the criticality probability of edge E is the product of its arrival tightness probability and the criticality probability of node 6, i.e., 0.6×0.5=0.3. Similarly, the criticality probability of edge A is 0.4×0.5=0.2, and that of edge F is 1.0×0.5=0.5. Thus, in general, the criticality probability of an edge is the product of its arrival tightness probability and the criticality probability of its destination node. The criticality probability of node 305 is the sum of the criticality probabilities of edges E and F, i.e., 0.5+0.3=0.8. In general, the criticality probability of a node is the sum of the criticality probabilities of its fanout edges. All the node and edge criticality probabilities have been shown for the sample circuit in FIG. 5. In general, node and edge criticality probabilities are determined by these simple methods during a levelized backward traversal of the timing graph.

Figure 6:
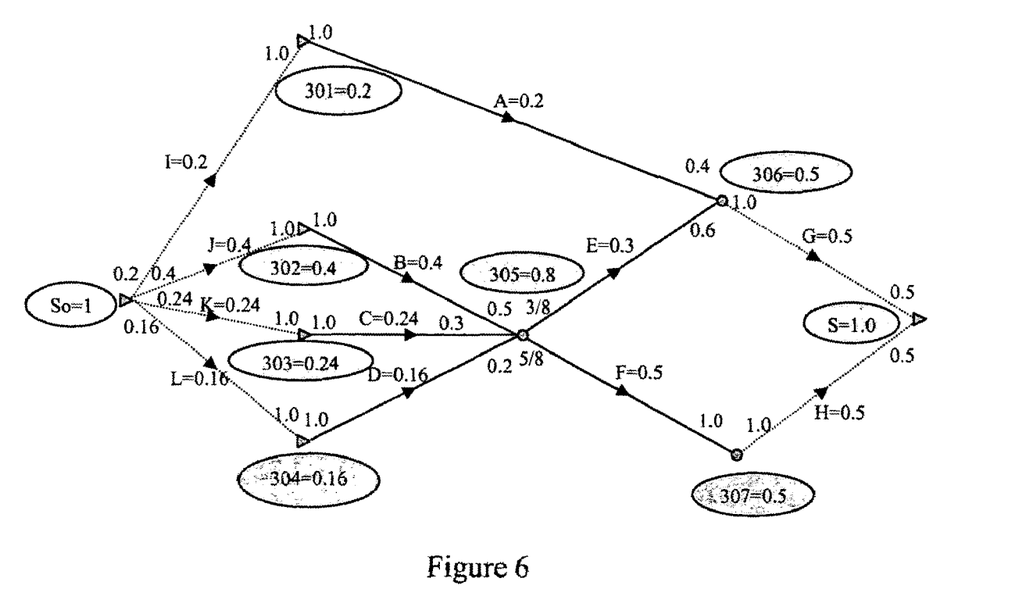
FIG. 6 shows the timing graph corresponding to the circuit of FIG. 3, with various backward-propagation required arrival tightness probabilities annotated on the graph.

The backward propagation of required arrival tightness probabilities is shown on the same sample timing graph in FIG. 6. At each node of the timing graph, the required arrival tightness probability (RATP) of a fanout edge is defined as the probability that that edge determines the required arrival time of the node. In FIG. 6, each edge has three probabilities annotated on it. The one near the source of the edge is the required arrival tightness probability; the one near the middle of the edge is the edge criticality probability; and the one near the sink of the edge is the arrival tightness probability. When there is only one fanout edge, as in the case of node 306, the required arrival tightness probability of that edge is simply 1.0, i.e., it determines the required arrival time of that node with 100% probability. At node 305, on the other hand, there is a 3/8 probability that the required arrival time of node 305 is determined by edge E and a 5/8 probability that it is determined by edge F. In general, the required arrival tightness probabilities of fanout edges of a node are in the proportion of their tightness probabilities, and must sum up to 1.0. Once the required arrival tightness probabilities have been propagated to the primary inputs, a procedure analogous to that followed during forward propagation is followed. A dotted line edge is added from a source node (labeled "So" in FIG. 6) to each primary input. The source node has a criticality probability of 1.0, and each of the dotted line edges has an arrival tightness probability of 1.0. Thus the edge criticality probability of each of these dotted line edges is equal to the criticality probability of the corresponding primary input, and the required arrival tightness probability of each edge is in turn equal to the dotted edge criticality probability.

If all of the propagations of arrival times, required arrival times, tightness probabilities and criticality probabilities are performed as above, there are a number of useful properties of these quantities that can be exploited heavily during analysis and optimization of a circuit:

1. Each of the source and sink nodes has a criticality probability of 100%.
2. The sum of the arrival tightness probabilities of all edges incident on any node of the timing graph is 100%.
3. The sum of the required arrival tightness probabilities of all edges emanating from any node of the timing graph is 100%.
4. The criticality probability of any edge is the product of its arrival tightness probability and the criticality probability of its sink node.
5. The criticality probability of any edge is the product of its required arrival tightness probability and the criticality probability of its source node.
6. The criticality probability of any node is the sum of the criticality probabilities of all edges emanating from that node.
7. The criticality probability of any node is the sum of the criticality probabilities of all edges incident on that node.
8. The sum of the criticality probabilities of all the primary inputs is 100%.
9. The sum of the criticality probabilities of all the end points (primary outputs for a purely combinational circuit) is 100%.
10. The sum of the edge criticalities of the edges of any cutset of the timing graph that separates the source and sink nodes into separate partitions is 100%.
11. The product of arrival tightness probabilities along any path of the timing graph is equal to the product of the required arrival tightness probabilities along the same path; both of these products represent the criticality probability of the path.
12. The sum of path criticality probabilities over all paths of the timing graph is 100%.
13. The arrival tightness probability of an edge is an upper bound on the criticality probability of any path that passes through that edge.
14. The required arrival tightness probability of an edge is an upper bound on the criticality probability of any path that passes through that edge.
15. The criticality probability of any edge is an upper bound on the criticality probability of any path passing through that edge.
16. The criticality probability of any timing node is an upper bound on the criticality probability of any path passing through that timing node.
17. The criticality probability of any node is the sum of the criticality probabilities of all paths in the fanout cone of that node.
18. The criticality probability of any node is the sum of the criticality probabilities of all paths in the fanin cone of that node.
19. The criticality probability of an edge is the sum of the criticality probabilities of all paths that pass through that edge.

The above properties can be exploited during analysis and optimization of a circuit. For example, during path enumeration, various upper bounds on path criticality listed above can be used to prune the list of paths as the list is generated, whether in a depth-first or breadth-first fashion. The list of paths may then be either reported to the user or submitted for more detailed analysis. During optimization, the edges and nodes with the highest criticality probabilities can be targeted for improvement. Therefore it is to be understood that the above quantities can be exploited in many different ways in a variety of contexts.

Figure 7:
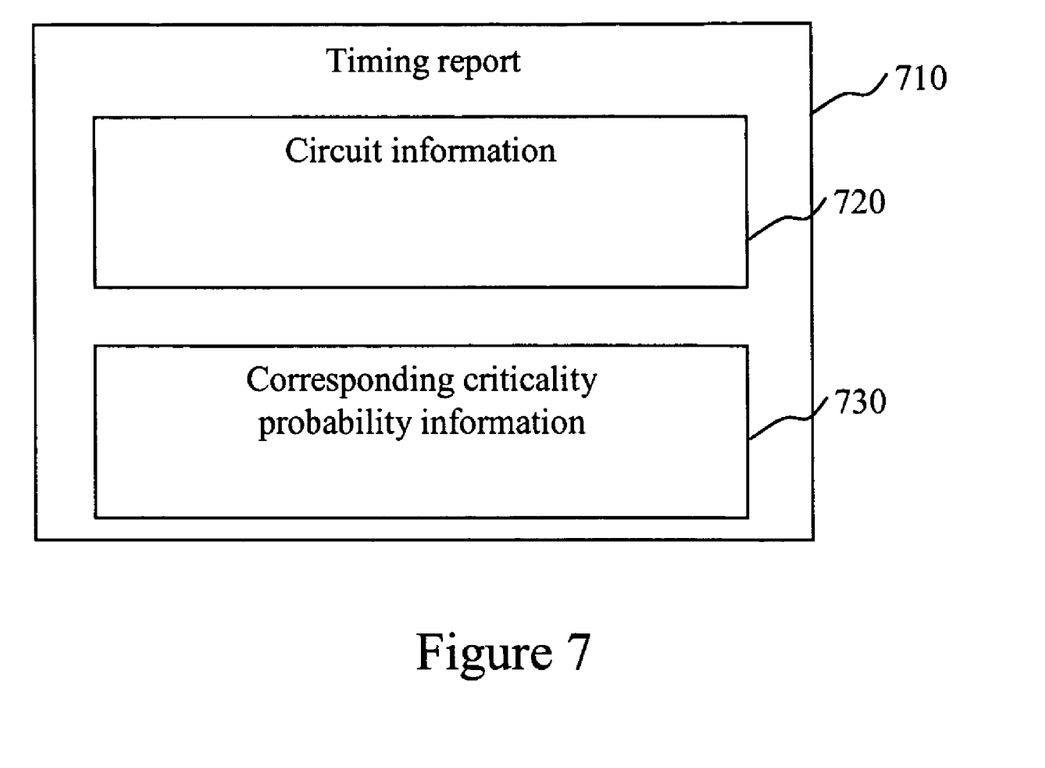
FIG. 7 is a block diagram of one preferred embodiment of an output report.

After the criticality determination procedure is complete, the results are fed back to the user by means of a programming interface or timing report stored in a hard disk file or files. Timing reports are illustrated in box 710 of FIG. 7. A timing report typically consists of circuit information (box 720) and criticality probability information (box 730). The results of the inventive criticality computations can be reported in conjunction with statistical timing results for easy digestion by the user. Circuit information can include a list of gates, components and wires; or a list of paths; or a list of nodes; or a list of sequential elements; or a list of end points (primary outputs and timing tests); or a list of clock phases; or a list of edges of the timing graph. These items can be sorted and filtered in various ways to make the report intuitive and productive to the reader of the report. The corresponding statistical timing criticality information in the case of a node, edge or path, could include the node's, edge's or path's criticality probability, respectively. The criticality probability could be reported on a global basis or on a per-endpoint basis. In addition, arrival tightness probabilities and required arrival tightness probabilities are available to be reported for each edge of the timing graph. Similarly, for a timing test, the criticality probability of the test may be reported. It is to be understood that each of the criticality probabilities in the above description can be one of an early-mode or late-mode criticality probability; one of a rising or falling criticality probability; and a criticality probability that is specific to a particular phase of a particular clock. It is to be further understood that once the criticality analysis is completed, these results can be reported in a variety of useful ways.

It is to be understood that the detailed description of this invention was explained in the context of a simple combinational circuit with a simple timing graph. One of ordinary skill in the art will be able to extend these concepts to accommodate separate rising and falling arrival times and delays; sequential circuits; circuits with transparent latches; extensions to handle slew (rise/fall time) propagation and effects; circuits with probabilistic guard times on the latch setup and hold tests; circuits with probabilistic guard times on dynamic circuit timing tests; circuits with multiple clock phases; probabilistic delay models that are purely random; probabilistic delay models that are correlated; sources of variation that are random; sources of variation that are correlated; and cases in which clock cycle periods and timing assertions are probabilistic.

Given this disclosure, it is apparent to one skilled in the art that the inputs received by the "Statistical criticality determination" process (box 140 of FIG. 1) can be any input generally known to computer systems, including but not limited to: keyboard or mouse entries, disk, tape, CD-ROM, network connection, fiber optic connection, radio frequency link, infra red link, etc. Further the outputs including the "Criticality of each edge, node and path of the timing graph" (box 150 of FIG. 1) and the "List of critical path(s) with criticality probabilities" (box 160 of FIG. 1) can take the form of any known computer output. These outputs include but are not limited to: printed output from a printer, images on a graphical user interface (GUI) or CRT, content on storage media (e.g., memory, CD-ROM, disk, diskette), files, information transmitted over a network (fiber optic, telephone, cable, radio frequency, infrared, etc.).

I claim:

1. A system for determining timing criticality information of an electrical circuit comprising:
   a. a netlist input for receiving a circuit netlist, the circuit netlist representing a topology of the electrical circuit;
   b. an assertion input for receiving one or more assertions representing boundary timing conditions;
   c. a delay variability input for receiving a list of one or more sources of delay variation that contain variability information of one or more of the sources of delay variation;
   d. a model input for receiving a parameterized delay model, the parameterized delay model containing a model for delay variation of each component of the electrical circuit, each model being a function of one or more of the sources of delay variation; and
   e. a process that determines and outputs the timing criticality information of the electrical circuit;
   wherein the timing criticality information is a node criticality probability of each of one or more nodes of the electrical circuit.

2. A system for determining timing criticality information of an electrical circuit comprising:
   a. a netlist input for receiving a circuit netlist, the circuit netlist representing a topology of the electrical circuit;
   b. an assertion input for receiving one or more assertions representing boundary timing conditions;
   c. a delay variability input for receiving a list of one or more sources of delay variation that contain variability information of one or more of the sources of delay variation;
   d. a model input for receiving a parameterized delay model, the parameterized delay model containing a model for delay variation of each component of the electrical circuit, each model being a function of one or more of the sources of delay variation; and
   e. a process that determines and outputs the timing criticality information of the electrical circuit;
   wherein the timing criticality information is a component criticality probability of each of one or more components of the electrical circuit.

3. A system for determining timing criticality information of an electrical circuit comprising:
   a. a netlist input for receiving a circuit netlist, the circuit netlist representing a topology of the electrical circuit;
   b. an assertion input for receiving one or more assertions representing boundary timing conditions;
   c. a delay variability input for receiving a list of one or more sources of delay variation that contain variability information of one or more of the sources of delay variation;
   d. a model input for receiving a parameterized delay model, the parameterized delay model containing a model for delay variation of each component of the electrical circuit, each model being a function of one or more of the sources of delay variation; and
   e. a process that determines and outputs the timing criticality information of the electrical circuit;
   wherein the timing criticality information is a path criticality probability of each of one or more paths of the electrical circuit.

4. The system as recited in claim 3, wherein the criticality probability of a component of the electrical circuit is used as an upper bound on the path criticality probability of any path of the electrical circuit including that component.

5. The system as recited in claim 3, wherein the criticality probability of a node of the electrical circuit is used as an upper bound on the path criticality probability of any path of the electrical circuit including that node.

6. The system as recited in claim 3, wherein the arrival tightness probability of a component of the electrical circuit is used as an upper bound on the path criticality probability of any path of the electrical circuit including that component.

7. The system as recited in claim 3, wherein the required arrival tightness probability of a component of the electrical circuit is used as an upper bound on the path criticality probability of any path of the electrical circuit including that component.

8. A system for determining timing criticality information of an electrical circuit comprising:
   a. a netlist input for receiving a circuit netlist, the circuit netlist representing a topology of the electrical circuit;
   b. an assertion input for receiving one or more assertions representing boundary timing conditions;
   c. a delay variability input for receiving a list of one or more sources of delay variation that contain variability information of one or more of the sources of delay variation;
   d. a model input for receiving a parameterized delay model, the parameterized delay model containing a model for delay variation of each component of the electrical circuit, each model being a function of one or more of the sources of delay variation; and
   e. a process that determines and outputs the timing criticality information of the electrical circuit, wherein the timing criticality information is used to determine a user-provided number of critical paths in order of criticality probability.

9. A system for determining timing criticality information of an electrical circuit comprising:
   a. a netlist input for receiving a circuit netlist, the circuit netlist representing a topology of the electrical circuit;
   b. an assertion input for receiving one or more assertions representing boundary timing conditions;
   c. a delay variability input for receiving a list of one or more sources of delay variation that contain vanability information of one or more of the sources of delay variation;
   d. a model input for receiving a parameterized delay model, the parameterized delay model containing a model for delay variation of each component of the electrical circuit, each model begin a function of one or more of the sources of delay variation; and
   e. a process tat determines and outputs the timing criticality information of the electrical circuit, wherein the timing criticality information is used to determine one or more critical pats in order of criticality probability until the sum of the criticality probabilities exceeds a user-provided probability threshold.

10. A system for determining timing criticality information of an electrical circuit comprising:
   a. a netlist input for receiving a circuit netlist, the circuit netlist representing a topology of the electrical circuit;
   b. an assertion input for receiving one or more assertions representing boundary timing conditions;
   c. a delay variability input for receiving a list of one or more sources of delay variation that contain variability information of one or more of the sources of delay variation;
   d. a model input for receiving a parameterized delay model, the parameterized delay model containing a model for delay variation of each component of the electrical circuit, each model being a function of one or more of the sources of delay variation; and
   e. a process that determines and outputs the timing criticality information of the electrical circuit;
   wherein a separate rising and a separate falling criticality information is determined from the timing criticality information for each of the one or more nodes of the electrical circuit and for each of the one or more components of the electrical circuit.

11. A system for determining timing criticality information of an electrical circuit comprising:
   a. a netlist input for receiving a circuit netlist, the circuit netlist representing a topology of the electrical circuit;
   b. an assertion input for receiving one or more assertions representing boundary timing conditions;
   c. a delay variability input for receiving a list of one or more sources of delay variation that contain variability information of one or more of the sources of delay variation;
   d. a model input for receiving a parameterized delay model, the parameterized delay model containing a model for delay variation of each component of the electrical circuit, each model being a function of one or more of the sources of delay variation; and
   e. a process that determines and outputs the timing criticality information of the electrical circuit;
   wherein the electrical circuit is a sequential circuit that contains one or more of the following: an edge-triggered latch, a master-slave latch, a level-sensitive latch, and a transparent latch.

12. The system as recited in claim 11, wherein a guard time of a timing test is one of deterministic and statistical.

13. A system for determining timing criticality information of an electrical circuit comprising:
   a. a netlist input for receiving a circuit netlist, the circuit netlist representing a topology of the electrical circuit;
   b. an assertion input for receiving one or more assertions representing boundary timing conditions;
   c. a delay variability input for receiving a list of one or more sources of delay variation that contain variability information of one or more of the sources of delay variation;
   d. a model input for receiving a parameterized delay model, the parameterized delay model containing a model for delay variation of each component of the electrical circuit, each model being a function of one or more of the sources of delay variation; and
   e. a process that determines and outputs the timing criticality information of the electrical circuit;
   wherein the electrical circuit contains multiple clock phases.

14. A system for determining timing criticality information of an electrical circuit comprising:
   a. a netlist input for receiving a circuit netlist, the circuit netlist representing a topology of the electrical circuit;
   b. an assertion input for receiving one or more assertions representing boundary timing conditions;
   c. a delay variability input for receiving a list of one or more sources of delay variation that contain variability information of one or more of the sources of delay variation;
   d. a model input for receiving a parameterized delay model, the parameterized delay model containing a model for delay variation of each component of the electrical circuit, each model being function of one or more of the sources of delay variation; and
   e. a process that determines and outputs the timing criticality information of the electrical circuit, wherein a clock-edge information is one of deterministic and statistical.

15. A method for determining timing criticality information of an electrical circuit, comprising the steps of:
   a. reading a netlist, one or more assertions, one or more parameterized delay models and a list of one or more sources of variation;
   b. building a timing graph that represents tire electrical circuit, the timing graph having one or more nodes and one or more edges;
   c. conducting a statistical timing analysis of the electrical circuit;
   d. storing an arrival tightness probability and a required arrival tightness probability at each of the one or more edges of the electrical circuit; and
   e. determining a criticality probability of each of the one or more nodes of the timing graph and the one or more edges of the timing graph by a backward traversal of the timing graph.

16. The method as recited in claim 15, wherein the criticality probabilities are determined on the basis of a single end point.

17. A method for determining timing criticality information of an electrical circuit, comprising the steps of:
   a. reading a netlist, one or more assertions, one or more parameterized delay models and a list of one or more sources of variation;
   b. building a timing graph that represents the electrical circuit, the timing graph having one or more nodes and one or more edges;
   c. conducting statistical timing analysis of the electrical circuit;
   d. storing an arrival tightness probability and a required arrival tightness probability at each of the one or more edges of the electrical circuit;
   e. determining an end point criticality probability of each of one or more end points of the timing graph; and
   f. determining a criticality probability of thd one or more nodes of the timing graph and the one or more edges of the timing graph by a backward traversal of the dining graph.

18. The method as recited in claims 15 and 17, wherein the timing criticality information is a path criticality probability of each of one or more paths of the electrical circuit.

19. The method as recited in claims 15 and 17, wherein the criticality probability of a component of the electrical circuit is used as an upper bound on a path criticality probability of any path of the electrical circuit including that component.

20. The method as recited in claims 15 and 17, wherein the criticality probability of a node of the electrical circuit is used as an upper bound on a path criticality probability of any path of the electrical circuit including that node.

21. The method as recited in claims 15 and 17, wherein the arrival tightness probability of a component of the electrical, circuit is used as an upper bound on a path criticality probability of any path of the electrical circuit including that component.

22. The method as recited in claims 15 and 17, wherein the required arrival tightness probability of a component of the electrical circuit is used as an upper bound on a path criticality probability of any path of the electrical circuit including that component.

23. The method as recited in claims 15 and 17, wherein the timing criticality information is used to determine a path that has the highest probability of being critical.

24. The method as recited in claims 15 and 17, wherein the timing criticality information is used to determine a user-provided number of critical paths in order of criticality probability.

25. The method as recited in claims 15 and 17, wherein the timing criticality information is used to determine a user-provided number of critical paths in order of criticality probability.

26. The method as recited in claims 15 and 17, wherein the timing criticality information is used to determine critical paths in order of criticality probability until the sum of the criticality probabilities exceeds a user-provided probability threshold.

27. The method as recited in claim 17, wherein the criticality probabilities are determined on the basis of the overall electrical circuit.

28. The method as recited in claims 15 and 17, wherein a late-mode criticality information is determined from the timing criticality information.

29. The method as recited in claims 15 and 17, wherein an early-mode criticality information is determined from the timing criticality information.

30. The method as recited in claims 15 and 17, wherein separate rising and falling criticality information is determined for each of the one or more nodes of the timing graph and for each of the one or more edges of the timing graph.

31. The method as recited in claims 15 and 17, wherein the electrical circuit is one or more of the following: combinational circuit, a sequential circuit, a static logic circuit, and a dynamic logic circuit.

32. The method as recited in claims 15 and 17, wherein the electrical circuit is a sequential circuit that contains one or more of the following: an edge-triggered latch, a master-slave latch, a level-sensitive latch, and a transparent latch.

33. The method as recited in claims 15 and 17, wherein a guard time of a timing test is one of deterministic and statistical.

34. The method as recited in claims 15 and 17, wherein the electrical circuit contains multiple clock phases.

35. The method as recited in claims 15 and 17, wherein the parameterized delay model for each component of the electrical circuit comprises one or more of: a deterministic part, a correlated part, and an independently random part.

36. The method as recited in claims 15 and 17, wherein the sources of variation are correlated.

37. The method as recited in claims 15 and 17, wherein the sources of variation are independent.

38. The method as recited in claims 15 and 17, wherein the parameterized delay models are prestored in a table.

39. The method as recited in claims 15 and 17, wherein the parameterized delay models are prestored as coefficients of delay equations.

40. The method as recited in claims 15 and 17, wherein the parameterized delay models are determined by circuit simulation on-the-fly.

41. The method as recited in claims 15 and 17, wherein each of the one or more assertions is one of deterministic and statistical.

42. The method as recited in claims 15 and 17, wherein a clock-edge information is one of deterministic and statistical.

43. A system for determining timing criticality information of an electrical circuit, comprising:
   a. means for reading a netlist, one or more assertions, one or more parameterized delay models and a list of one or more sources of variation;
   b. means for building a timing graph that represents the electrical, circuit, the timing graph having one or more nodes and one or more edges;
   c. means for conducting a statistical timing analysis of the electrical circuit;
   d. means for storing an arrival tightness probability and a required arrival tightness probability at each of the one or more edges of the electrical circuit; and
   e. means for determining the criticality probability of each of the one or more nodes of the timing graph and the one or more edges of the timing graph by a backward traversal of the timing graph.

44. A system for determining timing criticality information of an electrical circuit, comprising:
   a. means for reading a netlist, one or more assertions, one or more parameterized delay models and a list of one or more sources of variation;
   b. means for building a timing graph that represents the electrical circuit, the timing graph having one or more nodes and one or more edges;
   c. means for conducting statistical timing analysis of the electrical circuit;
   d. means for storing an arrival tightness probability and a required arrival tightness probability at each of the one or more edges of the electrical circuit;
   e. means for determining an end point criticality probability of each of one or more end points of the timing graph; and
   f. means for determining a criticality probability of each of the one or more nodes of the timing graph and the one or more edges of the timing graph by a backward traversal of the timing graph.

45. A memory storage device storing a method for determining timing criticality information of an electrical circuit, the method comprising the steps of:
   a. reading a netlist, one or more assertions, one or more parameterized delay models and a list of one or more sources of variation;
   b. building a timing graph that represents the electrical circuit, the timing graph having one or more nodes and one or more edges;
   c. conducting a statistical timing analysis of the electrical circuit;
   d. storing an arrival tightness probability and a required arrival tightness probability at each of the one or more edges of the electrical circuit; and
   e. determining a criticality timing probability of each of the one or more nodes of the timing graph and the one or more edges of the timing graph by a backward traversal of the timing graph.

46. A memory storage device storing a method for determining timing criticality information of an electrical circuit, the method comprising the steps of:
 a. reading a netlist, one or more assertions, one or more parameterized delay models and a list of one or more sources of variation;
 b. building a timing graph that represents the electrical circuit, the timing graph having one or more nodes and one or more edges;
 c. conducting statistical timing analysis of the electrical circuit;
 d. storing an arrival tightness probability and a required arrival tightness probability at each of the one or more edges of the electrical circuit;
 e. determining an end point criticality probability of each of one or wore end points of the timing graph; and
 f. determining a criticality probability of each of the one or more nodes of the timing graph and the one or more edges of the timing graph by a backward traversal of the timing graph.

47. An output product produced by a process for determining timing criticality information of an electrical circuit, the process comprising the steps of:
 a. reading a netlist, one or more assertions, one or more parameterized delay models and a list of one or more sources of varation;
 b. building a timing graph that represents the electrical circuit, the timing graph having one or more nodes and one or more edges;
 c. conducting a statistical timing analysis of the electrical circuit;
 d. storing an arrival tightness probability and a required arrival tightness probabilities at each of the one or more edges of the electrical circuit; and
 e. determining a criticality probability of each of the one or more nodes of the timing graph and one or more edges of the timing graph by a backward traversal.

48. An output product produced by a process for determining timing criticality information of an electrical circuit, the process comprising the steps of:
 a. reading a netlist, one or more assertions, one or more parameterized delay models and a list of one or more sources of variation;
 b. building a timing graph that represents the electrical circuit, the timing graph having one or more nodes and one or more edges;
 c. conducting statistical timing analysis of the electrical circuit;
 d. storing an arrival tightness probability and a required arrival tightness probability at each of the one or more edges of the electrical circuit;
 e. determining an end point criticality probability of each of one or more end points of the timing graph; and
 f. determining a criticality probability of each of the one or more nodes of the timing graph and the one or more edges of the timing graph by a backward traversal of the timing graph.

\* \* \* \* \*